United States Patent [19]
Swanson et al.

[11] Patent Number: 5,742,244
[45] Date of Patent: Apr. 21, 1998

[54] NONLINEAR RUN-LENGTH CODING

[75] Inventors: Robert Earl Swanson, Del Mar; Thomas Daniel Carr, Leucadia; Norman Lee Koren, Encinitas, all of Calif.

[73] Assignee: Eastman Kodak Company, Rochester, N.Y.

[21] Appl. No.: 636,075

[22] Filed: Apr. 22, 1996

[51] Int. Cl.⁶ .................................................. H03M 7/00
[52] U.S. Cl. ......................................................... 341/59
[58] Field of Search .............................. 341/58, 59

[56] References Cited

U.S. PATENT DOCUMENTS 4,914,438  4/1990  Kameyama ..................... 341/59
5,287,228  2/1994  Hitachi .

*Primary Examiner*—Howard L. Williams
*Attorney, Agent, or Firm*—William F. Noval

[57] ABSTRACT

An input string of binary data bits which is a random sequence of 0s and 1s is selectively spaced encoded into an output string of binary channel bits which is a sequence of 0s and 1s. An input string of binary data bits are recursively encoded according to run-length selection means having rate p/q where p is the number of input data bits that are encoded into q-channel bits. The channel bits obey constraints such that the encoding specifies an ordered n element list of integers that are the lengths of the selected runs of consecutive zeros, denoted $b_0-1, b_1-1, \ldots, b_{n-1}-1$, and such that the element list of integers does not contain all the integers between the minimum element, $b_0$, and the maximum element, $b_{n-1}$.

14 Claims, 9 Drawing Sheets

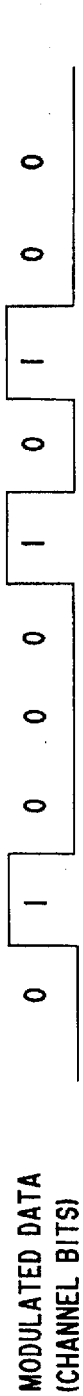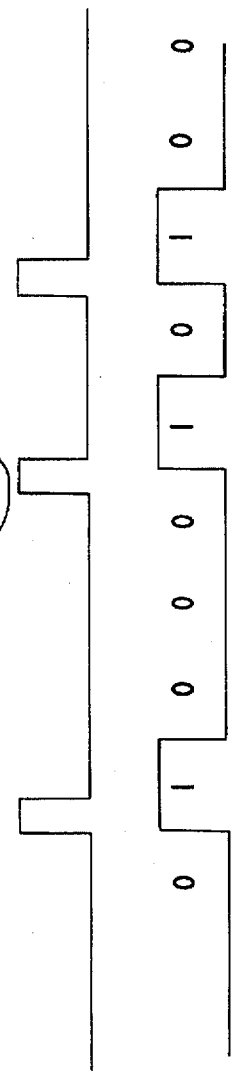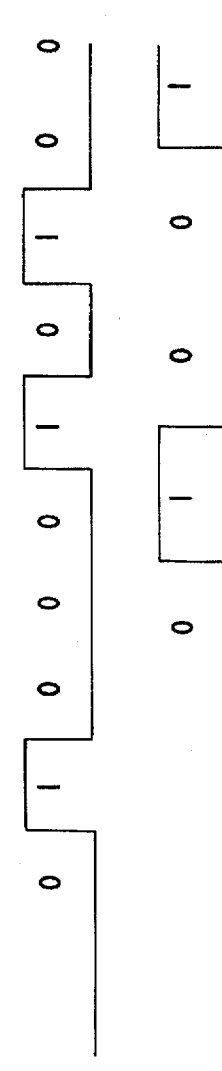
Fig.2(a) USER BINARY DATA
Fig.2(b) MODULATED DATA (CHANNEL BITS)
Fig.2(c) WRITE CURRENT CHANNEL BITS
Fig.2(d) READ VOLTAGE
Fig.2(e) PEAK DETECTION
Fig.2(f) RECOVERED CHANNEL BITS
Fig.2(g) DEMODULATED DATA

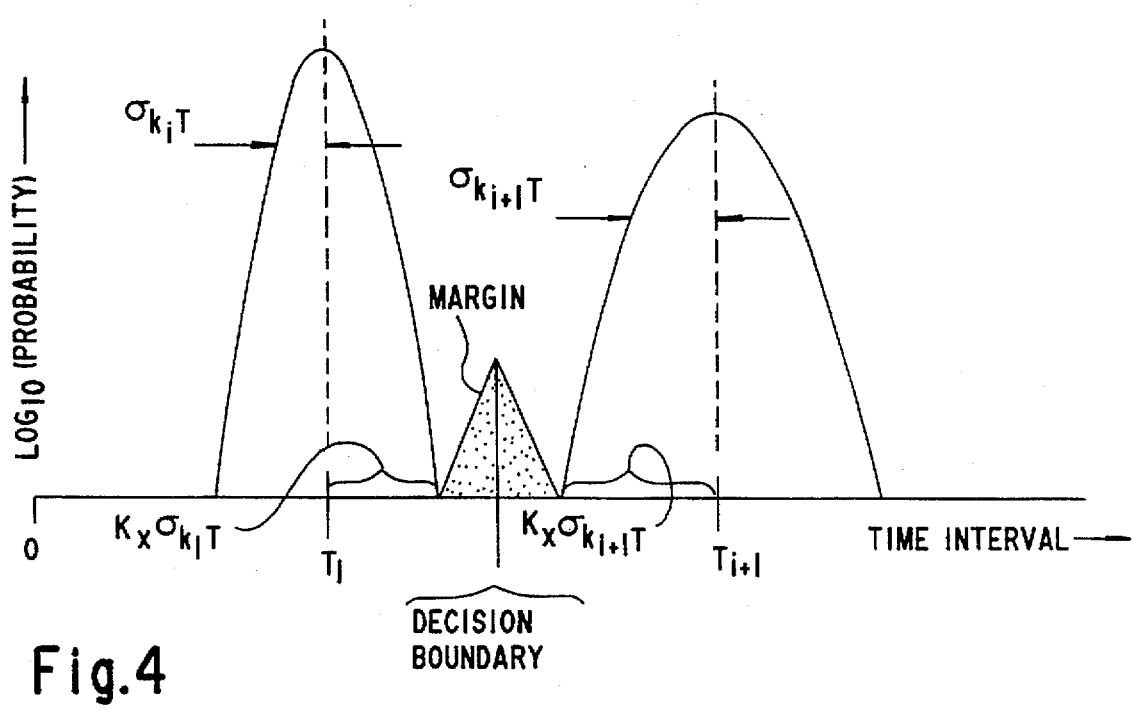
Fig.4
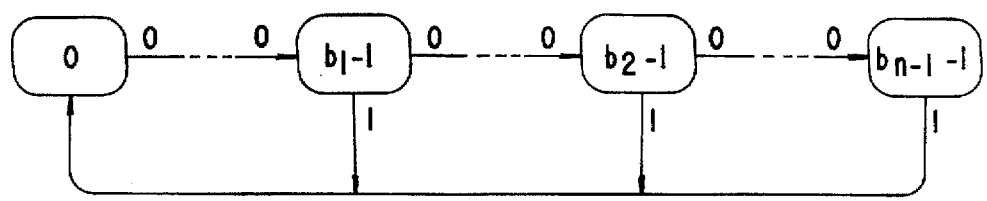
Fig.5(a)
$$T_{(b-1, \ldots b-1, \ldots b_{n-1}-1)} = \begin{vmatrix} 0 & 1 & 0 & 0 & 0 & 0 & 0 & & \text{ROW } 0 \\ & & \vdots & & & & & & \vdots \\ 1 & 0 & \ldots & 1 & 0 & 0 & 0 & 0 & \text{ROW } b_1-1 \\ & & \vdots & & & & & & \vdots \\ 1 & 0 & \ldots & & 0 & 1 & 0 & 0 & \text{ROW } b_2-1 \\ & & \vdots & & & & & & \vdots \\ 1 & 0 & 0 & \ldots & & & 1 & 0 & \text{ROW } b_i-1 \\ & & \vdots & & & & & & \vdots \\ 1 & 0 & 0 & \ldots & & & 0 & 0 & \text{ROW } b_{n-1}-1 \end{vmatrix}$$
Fig.5(b)

$$T_{(2,5,9,15)} =$$

```
0 0 0 0 0 0 0 0 0 0 0 0 0 0 1 0
0 0 0 0 0 0 0 0 0 0 0 0 0 1 0 0
0 0 0 0 0 0 0 0 0 0 0 0 1 0 0 0
0 0 0 0 0 0 0 0 0 0 0 1 0 0 0 0
0 0 0 0 0 0 0 0 0 0 1 0 0 0 0 0
0 0 0 0 0 0 0 0 0 1 0 0 0 0 0 0
0 0 0 0 0 0 0 0 1 0 0 0 0 0 0 0
0 0 0 0 0 0 0 1 0 0 0 0 0 0 0 0
0 0 0 0 0 0 1 0 0 0 0 0 0 0 0 0
0 0 0 0 0 1 0 0 0 0 0 0 0 0 0 0
0 0 0 0 1 0 0 0 0 0 0 0 0 0 0 0
0 1 0 0 0 0 0 0 0 0 0 0 0 0 0 0
0 0 1 0 0 0 0 0 0 0 0 0 0 0 0 0
1 0 0 0 0 0 0 0 0 0 0 0 0 0 0 0
0 0 0 1 0 0 0 0 0 0 0 0 0 0 0 0
0 0 0 0 0 0 0 0 0 0 0 0 0 0 0 1
```

Fig.9(a)
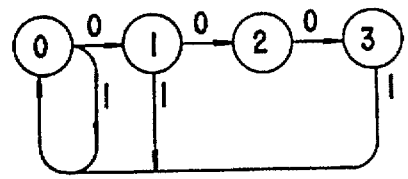
Fig.9(b)  $T_{(0,1,3)} = \begin{vmatrix} 1 & 1 & 0 & 0 \\ 1 & 0 & 1 & 0 \\ 0 & 0 & 0 & 1 \\ 1 & 0 & 0 & 0 \end{vmatrix}$
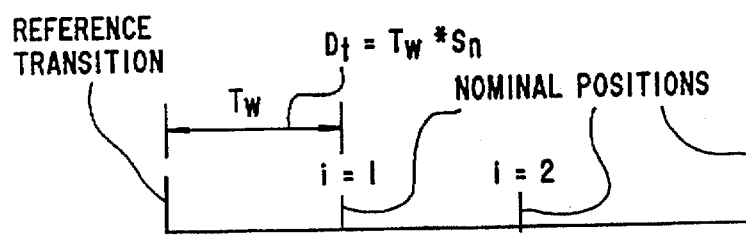
Fig.10(a)
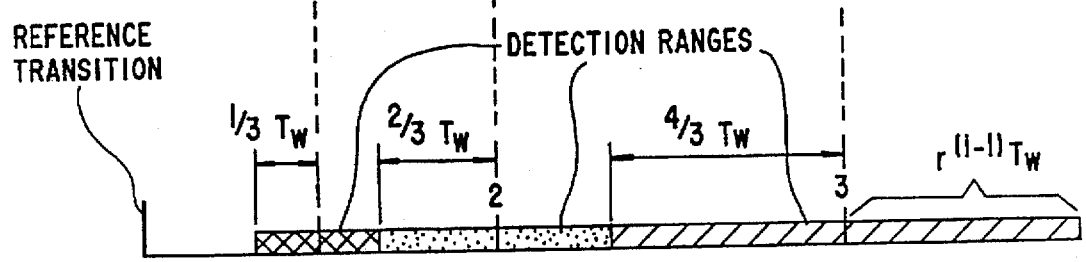
Fig.10(b)

NONLINEAR RUN-LENGTH CODING

FIELD OF THE INVENTION

This invention relates in general to the area of a digital data recording system known as modulation coding and especially relates to the encoding of user data for the purpose of recording in the presence of certain physical constraints imposed by the recording media and mechanism.

BACKGROUND OF THE INVENTION

Most recording systems, especially in magnetic recording, have taken steps to ensure that the movement of the recording media in relation to the recording head is essentially constant with the only speed variations being at a rate much lower than the lowest recorded frequency. Such a speed constraint allows for the use of a clock during modulation so that it is possible to reproduce that clock accurately prior to demodulation. In other words, the speed is constant within a narrow acceptable range during both the write and read operations. When this is the case, it has long been possible to use run-length limited (RLL) recording codes as the modulation means. When the speed varies too widely or too suddenly for clock recovery as accomplished by means such as phase-locked loops (PLL), regular RLL codes will not work. This is because these codes rely on the spacing between successive recorded transitions to be integral multiples of the clock time period and, further, that these transition locations are periodic after the first such location. This is not always the case in recording systems. Newer systems using photographic film, for example, have very poor speed control so that transition spacing varies widely and clock recovery is unreliable. Modulation coding has been used that writes both the user data and a clock so that no timing is implied and no PLL type clock recovery is required. Codes of this type, known as pulse position modulation (PPM), suffer rate losses over RLL coding since both a clock and data are recorded. It is desirable to have a modulation scheme that produces higher coding rates than are conventionally available in noisy environments. It is also desirable to provide a modulation coding scheme that considers both jitter and electronic/media noise. Such codes provide the maximum recording rates for mixed noise environments.

SUMMARY OF INVENTION

In general, according to the present invention, there is provided a solution to the above-mentioned needs of the prior art. According to a feature of the invention, there is provided a method and apparatus for the selection of code transition spacings in order to accommodate the combination of speed variations, i.e., jitter and electronic and media noise that are detrimental to RLL and PPM codes currently in use. The selection is based on the variances associated with each noise type and the determination of error tolerant detection regions for each transition spacing.

According to another feature of the present invention, there is provided a method of selectively spaced encoding of an input string of binary data bits which is a random sequence of 0s and 1s into an output string of binary channel bits which is a sequence of 0s and is, comprising the steps of: recursively encoding an input string of binary data bits according to run-length selection means having rate p/q where p is the number of input data bits that are encoded into q channel bits; wherein the channel bits obey constraints such that the encoding specifies an ordered n element list of integers that are the lengths of the selected runs of consecutive zeros, denoted $(b_0-1, b_1-1, \ldots, b_{n-1}-1)$ and the element list of integers does not contain all the integers between the minimum element, $b_0$, and the maximum element, $b_{n-1}$.

BRIEF DESCRIPTION OF THE DRAWINGS

FIG. 2 is a timing diagram for key signals in the data recording system.

FIG. 4 is a diagram of the timing interval analysis of two adjacent transition locations showing the regions of occurrence, standard deviations and decision boundary.

FIG. 5 is a state diagram and transition matrix for a selected run-length code.

FIG. 9 is a state diagram and T matrix of the (0, 1, 3) code.

FIG. 10 is a diagrammatic view which illustrates the spacing and tolerance windows for the (2,3) geometric code.

DETAILED DESCRIPTION OF THE INVENTION

Most modulation recording codes are devised from the information point of view in which high capacity is the desired quantity. The system on which the code is applied, then, often must be tuned in its performance to allow the modulation scheme's use. This is appropriate if it can be accomplished. Recording systems in which there is not good speed control, however, are examples of systems that have a parameter variance that is detrimental to high density coding performance. According to the present invention, a peak detection coding scheme is provided that first characterizes system performance and then devises a particular code to fit.

Figure 1:
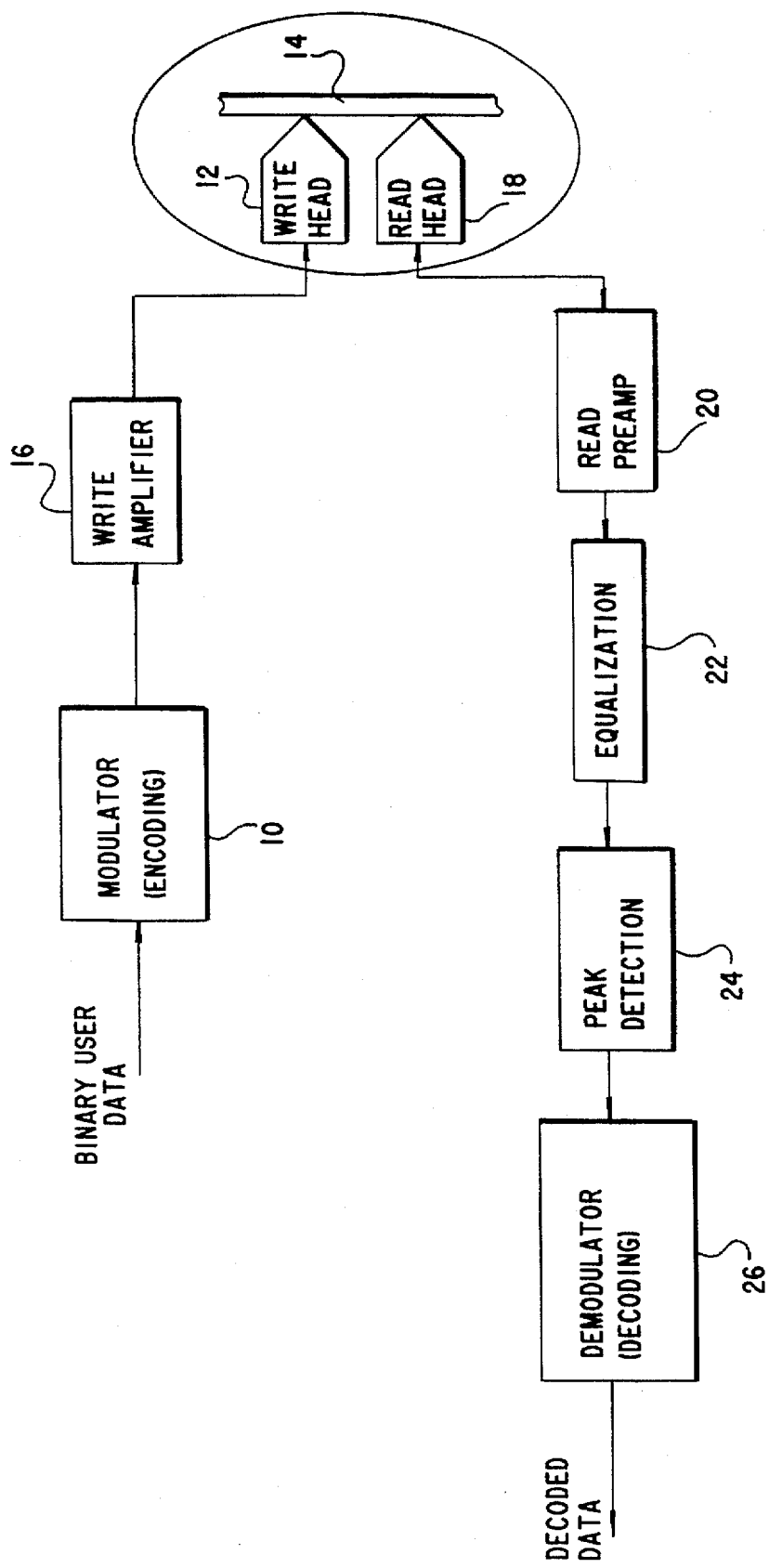
FIG. 1 is a block diagram of a typical recording system showing location of the modulation encoding and decoding.

In the typical recording system shown in FIG. 1 random binary data is entered into the modulator 10 which produces an encoded binary pattern of write current for the recording head 12 and media 14, after amplification in amplifier 16. On playback, the resulting flux transitions recorded on media 14 pass by the read head 18, are amplified by read preamp 20, equalized by equalization circuit 22 for best signal response, and then passed to a peak detector 24 which locates the positions of the recorded transitions. Each position is transferred to a demodulator 26 in the form of a pulse.

FIG. 2 illustrates these ideas as a timing diagram. At the top (FIG. 2(a)), some binary user data is modulated at a rate ⅔ for this example so that for every two user bits, three modulated bits result (FIG. 2(b)). These modulated bits are referred to as channel bits. The modulation rate (generally expressed as p/q, where p is the number of input data bits that are encoded into q channel bits) is one important criteria of any modulation method. Higher rates in this ratio are more desirable as that means a higher information transfer rate. Next, each channel bit equal to one in the modulation pattern causes a change in the write current (FIG. 2(c)). The write current is also a representation of the magnetization pattern on the media. The readback signal (FIG. 2(d)) is an analog of the flux change on the media which is then passed through a detection circuit that locates the peak of the readback signal (FIG. 2(e)). Notice that these peaks are the locations of the ones in the modulated bit pattern. If something is known about the timing of the channel bit pattern the bit cell times that coincide with these peaks are interpreted as ones and the remaining channel bit cells are interpreted as zeros. The channel bits recovered (FIG. 2(f)) in this way are then passed though a demodulator to obtain the demodulated user data (FIG. 2(g)). The key notion in the above strategy for data recording is "if something is known about the timing of the channel bit pattern." Recording systems without good speed control make the recovery of timing information difficult or impossible to bring about.

Figure 3:
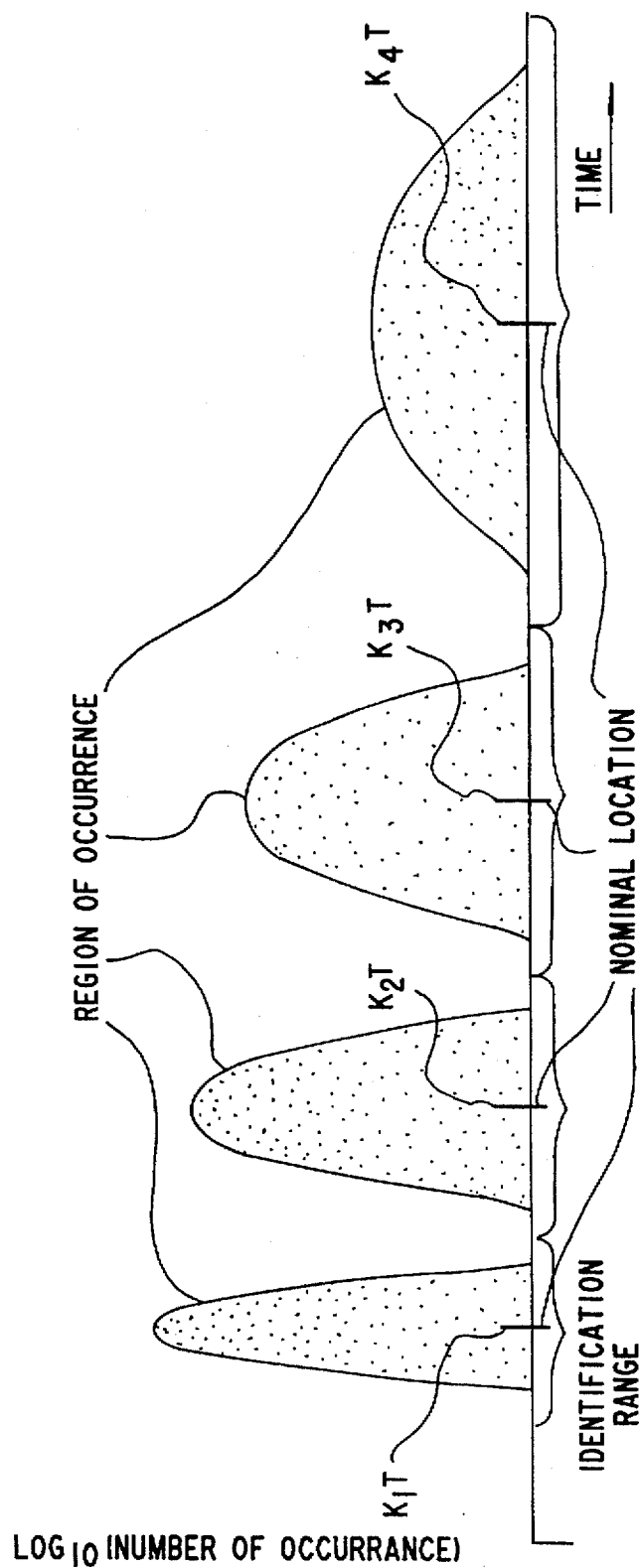
FIG. 3 is a timing interval diagram of four transition spacings showing the region of occurrence of each spacing.

Note also in FIG. 2 that the channel bit pattern and the write current have variable spacings for the ones and current transitions, respectively. Control of these spacings is the means for an encoding scheme. The difficulty arises when the recording system produces uncertainty in the position of the readback peaks. If this uncertainty is severe enough there is no possibility to recover timing in the channel bit pattern so that the channel data itself will be unrecoverable. Consider FIG. 3 in which a set of four nominal coding transition locations are shown along with their regions of occurrence in a typical noisy system. Such a picture is obtained from the timing interval analysis of a set of recorded transitions. The shaded regions of occurrence indicate the uncertainty in detected position of the recorded transition. Area under the curve of each shaded region is the total number of occurrences for the enclosed nominal location. The picture also serves to illustrate an identification range for each transition position. If the regions of occurrence are too broad because of too much speed jitter and too much noise there will be overlap in adjacent regions leaving no margin for differentiation of a peak detected near the boundary of a region of occurrence. In a practical system it is essential that there be a clear identification range for every transition location and a margin of space between adjacent regions of occurrence. This means that it is important to characterize the regions of occurrence so that any proposed set of transition locations can be assured of having no overlap in any two adjacent regions.

The method of the present invention is to determine the best nominal locations for transitions to occur given electronic and media noise and jitter properties for a system. Each region of occurrence can be decomposed into a fixed component of noise due to the electronics and a variable component due to the jitter. The fixed component is an additive amount that does not depend on transition spacing. The variable component is a multiplicative amount and is absolutely dependent upon spacing from the previous transition. For this analysis both components are considered as noise, just that one is additive and the other multiplicative where the contribution is the product of some system constant and the distance from the last position.

Returning to FIG. 3, note that the vertical axis is the log of the probability of occurrence so that the regions indicated are distributions of events. They are, in fact, Gaussian distributions. It is valuable to know the standard deviations of any total region of occurrence and the standard deviations of each component. Call these deviations $\sigma_{kT}$, $\sigma_N$, and $\sigma_{jkT}$ for the standard deviation of the total region of occurrence at position kT, the standard deviation for electronic and media noise, and the deviation for jitter at position kT, respectively. For most systems the standard deviation due to jitter is the product of a system constant, $\rho$, and the interval, $T_i$, such that $\sigma_{jkT}=\rho T_i$. Using these definitions the relation for the standard deviation of the total region of occurrence is:

$$\sigma_{ai}=\sqrt{\sigma_a^2+\sigma_x^2} \quad \sigma_{kT}=\sqrt{(\sigma_N)^2+(\sigma_{jkT})^2}=\sqrt{(\sigma_N)^2+(\rho T_i)^2}$$

where the first nominal location is at T units and all subsequent ones are at kT units, for various values of k and k not necessarily an integer. The values of $\sigma_N$ and $\sigma_{jkT}$ can be found experimentally or analytically. The important idea is that there is an additive element and a multiplicative element in the total standard deviation.

FIG. 4 illustrates the above situation for two adjacent regions of occurrence at locations $T_i$ and $T_{i+1}$. The margin is the space in between humps, which must not overlap. The limit of an acceptable condition is where the two regions just touch. It is useful to know the width of each hump at its base. As indicated in FIG. 4, that width is the product of some constant, $K_x$, with the standard deviation for the hump location. This constant is the relationship for the distribution width as a function of distance down from the peak and the standard deviation. It expresses the distribution width for a given probability of occurrence. The width of the distributions at the base as chosen by the designer is a measure of the error probability that is acceptable so that for given probability level $10^{-x}$ there is a constant, $K_x$. Some useful values for $K_x$ are 3.719 for x=4, 4.265 for x=5, and 4.756 for x=6. This simple probability level relation is useful in determining a set of n values for k consisting of $k_i$ where $1 \leq k_i \leq n$. The values, $k_i$, are the relative spacings for all nominal transition locations with the first location at $k_1=1$. Given the values of the constants and the standard deviation components an iterative approach is used to find the best locations, $k_i$, for the chosen probability criteria. The iterations proceed until a "fit" is obtained among the values $k_i$, $k_{i+1}$, and their respective values of $K_x\sigma_{kT}$. This is one practical method for finding desirable relative locations for transitions, however, any method for selecting them is acceptable to the actual code construction, which follows.

Construction of a selectively spaced recording code begins with the set of n relative locations, $K=\{k_1, k_2, \ldots, k_n\}$. Such a code has n possible sites for a next transition given the present transition. The set K is normalized so that $k_1=1$. Generally, this set of locations is very irregularly spaced since the $k_i$'s are not all integer. In order to build a practical encoder it is necessary to have a set of locations that are integer, hence, we make a new set, $B=\{b_i\}$, such that all the $b_i$'s are integers and $b_1$ is not necessarily 1. This can be done by forming the set of integers $B=\{b_1, b_2, \ldots, b_n\}$ where each $b_i/b_1$ is close enough to its respective $k_i$ to be acceptable. As $b_1$ increases the difference between the ratio $b_i/b_1$ and $k_i$ decreases. For some value of $b_1$ this difference for all $k_i$ is acceptably small. The choice of $b_1$ is a tradeoff between position accuracy over the whole range of K and the practicality of encoder construction. Typically, the larger $b_1$ is, the more complex the construction becomes.

Since the set of integers B lists the only locations at which transitions can occur this implies that these are the locations of the ones in a binary coding scheme. Therefore, the set $B-1=\{b_i-1\}$ for all i is a list of the allowable runs of zeros in the same binary coding scheme. Codes of this type are designated by the list of zeros in the run-lengths. This list contains the selection of specific run-lengths needed to satisfy the chosen system criteria. If B contains all the integers between $b_1$ and $b_n$, that is, if $b_n-b_1=n-1$ then we have the case of conventional (d,k) run-length limited coding. The description of this disclosure is the generalization of run-length coding and has conventional (d,k) codes as a subset. Conventional run-length coding occurs when the multiplicative jitter constant, $\sigma_{jkT}$, is negligible compared to the additive noise constant, $\sigma_N$. At the other extreme, when the noise constant is negligible compared to the jitter constant, the transition locations are successive multiples, namely, $B=\{b_1, rb_1, r^2b_1, r^3b_1, \ldots, r^{n-1}b_1\}$, where r is a multiplier determined from the system parameters, $\sigma_{jkT}$, in this case.

In order to implement codes of this type it is useful to construct a state diagram and a state transition matrix, T. FIGS. 5(a) and 5(b), respectively, shows state diagram and T matrix for the general selected run-length code for a transition location set B. The T matrix is an n matrix of zeros except all ones on the superdiagonal and ones in the first column at the locations of B. Once the T matrix is determined the steps to developing an encoding table are well known. These steps are:

1. Find the code capacity, C.
2. Chose an actual code rate, p/q<C.
3. Use a method such that of the Adler reference, R. Adler, D. Coppersmith, and M. Hassner, "Algorittuns for Sliding Block Codes," IEEE Trans. Inf. Theory, Vol. IT-29, No. 1, pp. 5–22, 1983, to produce an encoder state table from the T matrix.
4. Use state design methods for circuit design of the resulting state table.

Because the resulting T matrices are often very sparse and have very few non-zero elements in the first column the capacities are usually low, making the practical code rates, p/q, low. This is especially true when $b_1$ is not 1. In order to get the best spacing for the number of magnetic transition positions, n, $b_1$ is usually not 1. This does not mean that the recording system is of low efficiency. Instead what is happening is that we are creating a fine granularity or resolution of the spacing by increasing $b_1$. During recording the minimum spacing is ultimately determined by other system considerations such as head gap width, SNR (signal-to-noise ratio), media spacing and the like. What really matters in terms of system efficiency is the density ratio, bits per inch/flux changes per inch. This ratio relates input information to recorded information. For selective run-length codes the density ratio is b p/q.

Figures 6A, 6B:
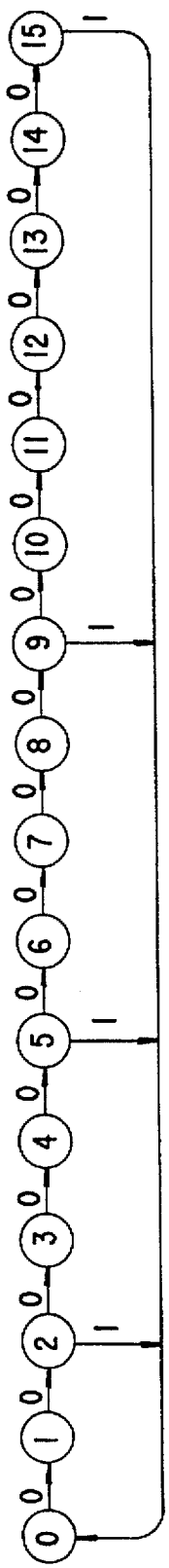
FIG. 6 is a state diagram and T matrix of the (2, 5, 9, 15) code.

Consider an example in which B={3, 6,$^1$10, 16}. FIGS. 6(a) and 6(b) show the state transition diagram and the T matrix for this set of run-lengths. After finding the largest eigen value, $\lambda$, and knowing that $\lambda=2^c$ we find a capacity of 0.2956. This means a code of rate 2/7 is possible and the density ratio will be 6/7. Using the method of Adler, et al. (referenced above) to produce the actual code of rate 2/7, an approximate eigen vector, v=[4 5 6 3 4 5 2 2 3 4 1 1 2 2 3], is found to satisfy the relation $T^7v\leq2^2v$. The state splitting techniques of the literature are used to produce the encoding table of Table I for the (2, 5, 9, 15) code.

TABLE I

THE ENCODING TABLE FOR THE (2, 5, 9, 15) RATE 2/7 CODE

| Input | 00 | 01 | 10 | 11 |
|---|---|---|---|---|
| Present State | | | | |
| 0 | 0100100,4 | 0100100,5 | 0000100,4 | 0000100,5 |
| 1 | 0100100,6 | 0100100,7 | 0000100,2 | 0000100,16 |
| 2 | 0100000,4 | 0100000,5 | 0100000,6 | 0100000,7 |

TABLE I-continued

THE ENCODING TABLE FOR THE (2, 5, 9, 15) RATE 2/7 CODE

| Input | 00 | 01 | 10 | 11 |
|---|---|---|---|---|
| 3 | 0100000,8 | 0000000,0 | 0000000,1 | 0100100,8 |
| 4 | 0010010,9 | 0010010,10 | 0010010,11 | 0010010,12 |
| 5 | 0010010,13 | 0010010,14 | 0000010,8 | 0000010,17 |
| 6 | 0000000,4 | 0100100,9 | 0000100,10 | 0000000,5 |
| 7 | 0000000,19 | 0010000,13 | 0010000,14 | 0000010,13 |
| 8 | 0010000,9 | 0010000,10 | 0010000,11 | 0010000,12 |
| 9 | 1000001,0 | 1000001,1 | 1000001,2 | 1000001,3 |
| 10 | 1001001,0 | 1001001,1 | 1001001,2 | 1001001,3 |
| 11 | 0000000,9 | 0000000,10 | 0001000,0 | 0001000,1 |
| 12 | 0001000,15 | 0000000,15 | 0000000,13 | 0000001,14 |
| 13 | 0001001,0 | 0001001,1 | 0001001,15 | 0000001,18 |
| 14 | 1001000,0 | 1001000,1 | 1001000,2 | 1001000,3 |
| 15 | 1000000,0 | 1000000,1 | 1000000,2 | 1000000,3 |
| 16 | 0100000,8 | 0000010,9 | 0000010,10 | 0000010,13 |
| 17 | 0000000,14 | 0010000,13 | 0010000,14 | 0000001,14 |
| 18 | 0001000,15 | 0000000,0 | 0000000,1 | 0001000,1 |
| 19 | 0000000,9 | 0000010,9 | 0000010,10 | 0000010,13 |

Output, Next State

Figure 7:
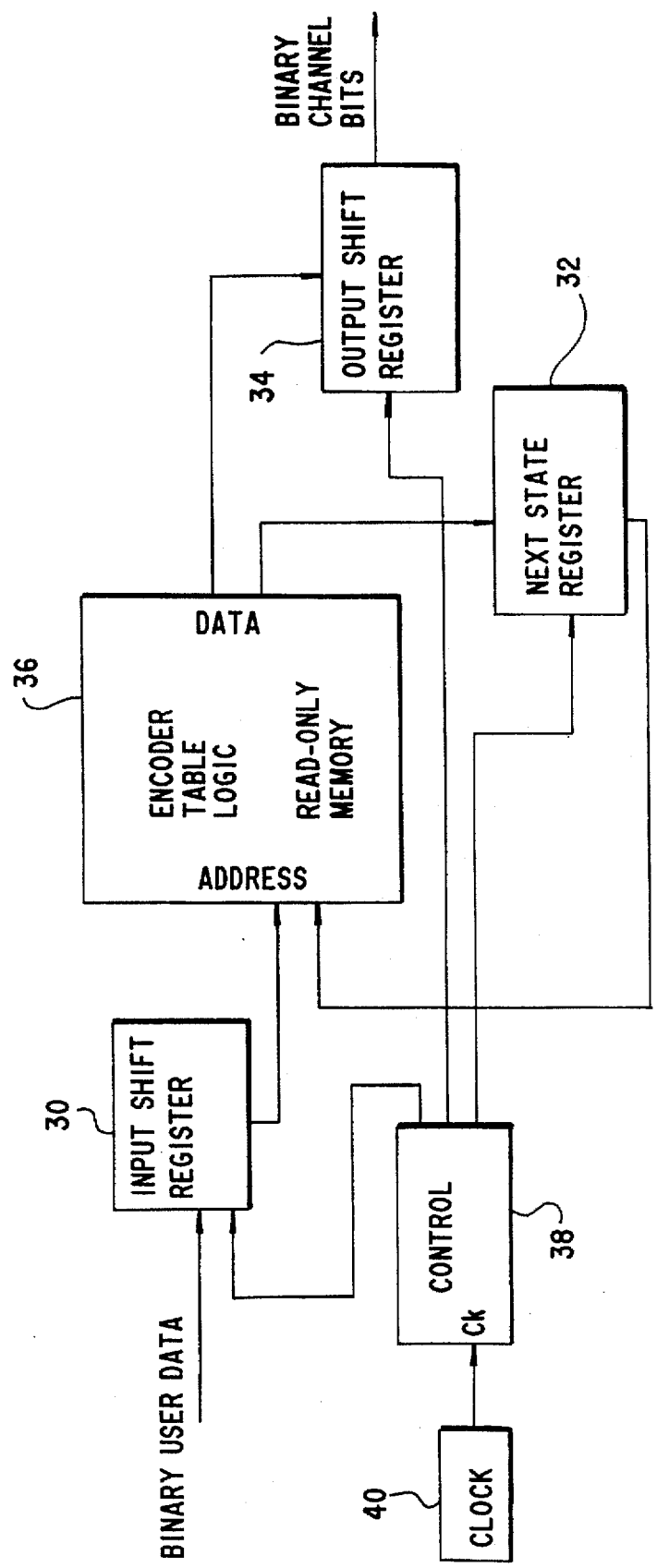
FIG. 7 is a block diagram of the encoding apparatus for the (2, 5, 9, 15) code.

The encoding circuit is illustrated in FIG. 7 for this code. The circuit consists of an input serial-to-parallel shift register 30 to receive the user data to encode, a state register 32 to hold the present state of the encoding process, an output parallel-to-serial shift register 34 to receive and shift out the channel bit sequence determined by the encoding table, a read-only memory 36 to hold next state and output information and a control circuit 38 and clock 40 to coordinate timing among these events. The input data register 30 is clocked at rate p, 2 in this example, and the output register is clocked at rate q, 7 in this example. Essentially, the encoding table is cast in the read-only memory 36 of the state machine. Each entry is accessed by an address made up of the present state and the current data input. The read-only memory 36 contents are the next state, which is loaded into the next state register 32 and the output channel bits, which are loaded into the output register 34. Channel bits loaded into the output register 34 are shifted out as new data is shifted into the input register 30. Every 2 input clocks are accompanied by 7 output clocks so that as the output register 34 is emptied the input register 30 is filled.

Figure 8:
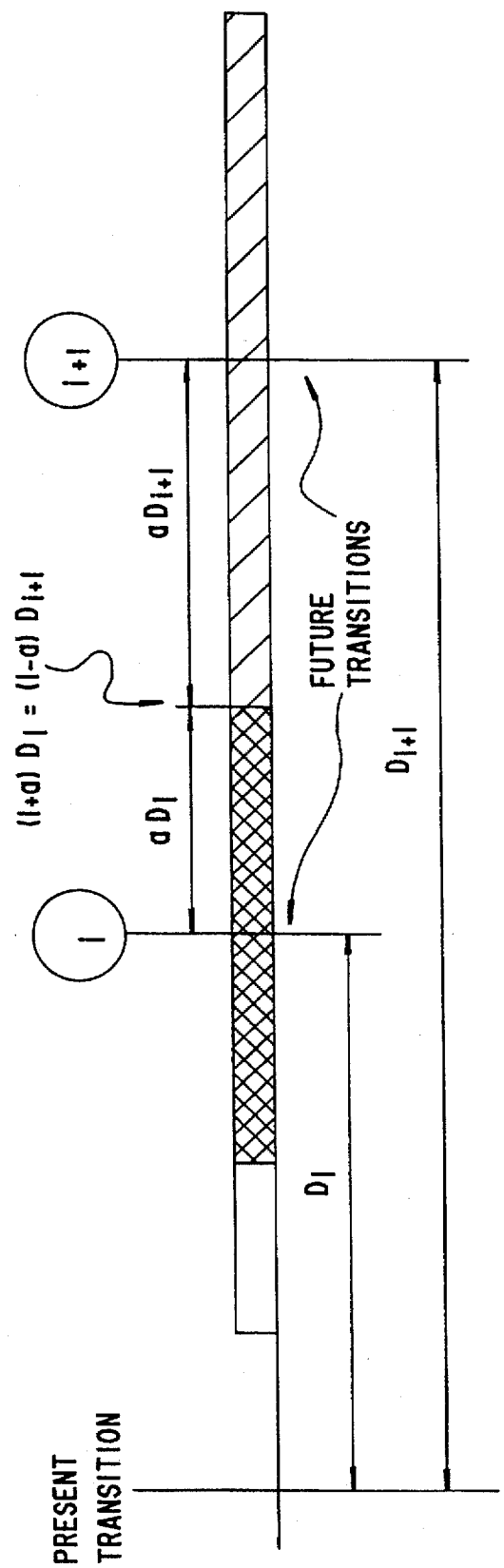
FIG. 8 is a transition spacing diagram for the geometrically spaced codes.

A second example in which only jitter is considered results in a transition spacing diagram shown in FIG. 8 for three transition positions. Two adjacent positions labeled i and i+1 are spaced at distances $D_i$ and $D_{i+1}$ from the present transition. If $\sigma_N=0$, i.e., negligible, then the identification ranges (shown shaded) touch at some point $aD_i$ beyond $D_i$ and $aD_{i+1}$ short of $D_{i+1}$. Therefore, the ratio $D_{i+1}/D_i=(1+a)/(1-a)=r$ for any positions $D_i$ and $D_{i+1}$. As mentioned earlier, this results in the set of locations:

$$B=\{b_1, rb_1, r^2b_1, r^3b_1, \ldots, r^{n-1}b_1\}.$$

A more compact notation for this geometric subset of selective run-length coding is (r, n) where r is the ratio number defined above and n is the number of transition locations included.

An example of this geometric code subset is the (2, 3) code with B={1, 2, 4}. (If the code were designated as a selective run-length code it would be identified as (0, 1, 3) for the appropriate runs of zeros used.) FIGS. 9(a) and 9(b) are, respectively, the state diagram and T matrix for this code. Using the steps outlined above this three element code has capacity 0.8115 which allows rate 4/5. An approximate eigen vector of v=[4 3 1 2] satisfies the relation $T^5v\leq2^4v$ which on state splitting yields the encoding table of Table II.

TABLE II

THE ENCODING TABLE FOR THE (2, 3) RATE 4/5 CODE

| Present State | A | B | C | D | E |
|---|---|---|---|---|---|
| Input | | | | | |
| 0 | 11111,A | 10101,A | 01111,A | 00011,A | 00111,A |
| 1 | 11101,A | 10001,A | 01011,A | 01101,A | 00101,A |
| 2 | 11011,A | 11110,A | 01010,A | 10110,A | 10110,A |
| 3 | 10111,A | 11010,A | 01110,A | 00010,A | 00110,A |
| 4 | 11111,B | 10101,B | 01000,A | 11000,A | 11000,A |
| 5 | 11101,B | 10001,B | 01111,B | 00011,B | 00111,B |
| 6 | 11011,B | 11110,B | 01011,B | 01101,B | 00101,B |
| 7 | 10111,B | 11010,B | 01010,B | 10110,B | 10110,B |
| 8 | 11111,C | 11111,D | 01110,B | 00010,B | 00110,B |
| 9 | 11101,C | 11101,D | 01000,B | 11000,B | 11000,B |
| 10 | 11011,C | 11011,D | 01111,C | 00011,C | 00111,C |
| 11 | 10111,C | 10111,D | 01011,C | 01101,C | 00101,C |
| 12 | 10101,C | 10101,D | 01111,D | 00011,D | 00111,D |
| 13 | 10001,C | 10001,D | 01011,D | 01101,D | 00101,D |
| 14 | 11100,C | 11110,E | 01010,E | 10110,E | 10110,E |
| 15 | 10100,C | 11010,E | 01110,E | 00010,E | 00110,E |
| | | | Output, Next State | | |

This code is illustrated in FIG. 10. For reference, the codes can be labeled according to their spacing ratio, r, and number of possible transitions, n, using the 2-tuple (r,n). The code in FIG. 4a has n=3 and r=2 so that it allows for ±33% detection range using three transition positions. The number of transition locations relates directly to capacity. Larger n gives greater capacity, but the increase is asymptotic toward a limit. Table I shows capacities for (2,n) codes for several values of n. Notice that capacity increases very little for n≧3. Three transitions turns out to be the smallest value of n giving a capacity above 0.8 for which a code exists at rate 4/5.

TABLE III

Capacity For Several Values of n in Geometric Codes Having r = 2

| | n | | | |
|---|---|---|---|---|
| t (r) | 2 | 3 | 4 | 5 |
| ⅓ (2) | .6942 | .8115 | .8208 | .8208 |

For ratios, r, that are integers it is enough to speak of capacity for the code, that is, some number of input bits will encode into some number of code bits, 4 to 5 in the example. However, when r is not an integer the transition spacings are uneven multiples of a high frequency clock. Because of this, it is clearer to calculate the density ratio of input bits per inch to flux changes per inch, BPI/FCI. Table IV shows the BPI/FCI for several (r,n) codes for various values of r and n. Again, for given spacing tolerance, there is a limit to BPI/FCI as n increases. Notice that the BPI/FCI becomes larger than one as the jitter tolerance decreases.

TABLE IV

Density Ratios, BPI/FCI, for Various (r, n) Codes

| | n | | | |
|---|---|---|---|---|
| t (r) | 2 | 3 | 4 | 5 |
| ½ (3) | .5515 | .5762 | .5762 | .5762 |
| ⅓ (2) | .6942 | .8115 | .8208 | .8208 |
| ¼ (5/3) | .7659 | .9621 | .9981 | |
| ⅕ (3/2) | .8116 | 1.0632 | 1.1376 | 1.1536 |
| ⅐ (4/3) | .8622 | 1.1925 | 1.3302 | 1.3842 |

Figure 11:
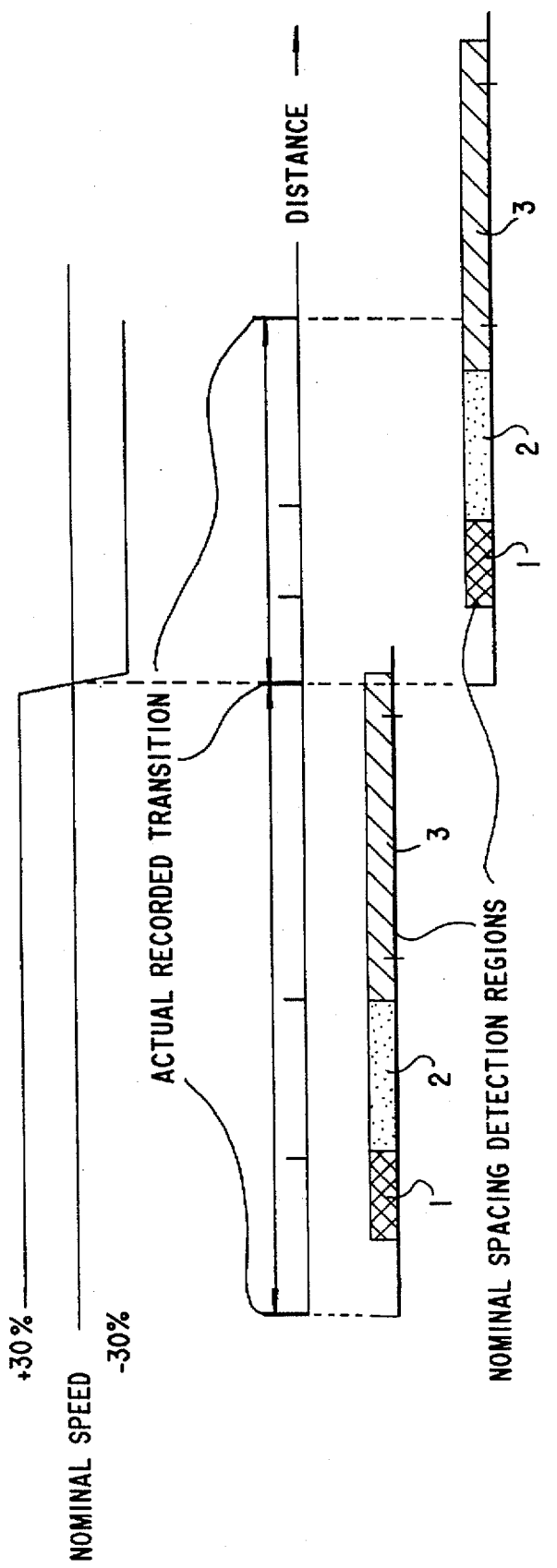
FIG. 11 is a diagrammatic view which shows the effect of spacing tolerance for maximal length transition distance during above and below nominal recording speeds in the (2,3) geometric code.

The effectiveness of geometric codes is illustrated in FIG. 11 by the placement of two transitions at maximal distances, code positions for i=3, using the (2,3) code at the recording speeds shown. At the top of the figure we see s speed profile having a 30% over nominal speed for the left side of the illustration and a 30% under nominal speed for the remainder. The speed differences force the writing of these transitions, shown as bold vertical marks on the distance axis, to be spaced further than nominal and closer than nominal, respectively. From the lower portion of the figure, it is seen that the ±30% displacement still allows the detected transition to occur within the shaded area corresponding to the detection region for the transition, i=3. This will allow proper decoding.

It will be understood that a wide range of specific spacings are possible for a variety of systems using various values of $\sigma_N$ and $\sigma_{jkT}$. Perhaps, other factors or standard deviations can also be invoked, however, these would only lead to additional sets of locations, B. The methods of this invention recognize that suitable codes for atypical run-length recording applications are found and means are described for generating the associated encoding table. Thereafter, the apparatus of state logic design is applicable to code construction. Two practical examples have been shown.

Technical Effect and Advantage

The present invention finds application in digital data systems in which digital data is recorded or transmitted. The invention has the following advantages.

1. Encoding of digital data with high tolerance to jitter.
2. Encoding rate of digital data is optimized.

The invention has been described in detail with particular reference to preferred embodiments thereof, but it will be understood that variations and modifications can be effected within the spirit and scope of the invention.

What is claimed is:

1. A method of selectively spaced encoding of an input string of binary data bits which is a random sequence of 0s and 1s into an output string of binary channel bits which is a sequence of 0s and 1s, comprising the steps of:

recursively encoding an input string of binary data bits according to run-length selection means having rate p/q where p is the number of input data bits that are encoded into q channel bits; wherein the channel bits obey constraints such that the encoding specifies an ordered n element list of integers that are the lengths of the selected runs of consecutive zeros, denoted ($b_0$–1, $b_1$–1, ..., $b_{n-1}$–1) where the elements of the list are not all equally spread, wherein there exists three consecutive elements of the list ($b_i$, $b_j$, $b_k$), such that $b_j$–$b_i \neq b_k$–$b_j$; and wherein successive spacings between elements are nonlinear and increase from previous spacings, thus optimizing encoding in a high jitter environment.

2. The method of claim 1 wherein (a) the code of said channel bits has the desired spacings of magnetic transitions at locations designated by the n element set K={1, $k_1$, $k_2$, ..., $k_{n-1}$} where the $k_i$ are real rational numbers;

(b) the set $\{b_0, b_1, \ldots, b_{n-1}\}$ is a set of integers such that the ratios, $b_i/b_0$ for each $b_i$, $0 \leq i \leq n-1$, are acceptably close to the respective $k_i$;

(c) the set of n elements, $\{b_0-1, b_1-1, \ldots, b_{n-1}-1\}$, are the desired run-lengths of zeros and specify a code of claim 1; and (d) the code is, specifically, specified by this later set, $(b_0-1, b_1-1, \ldots, b_{n-1}-1)$, of elements.

3. The method of claim 1 wherein the code of said channel bits is described by a transition matrix, T, that has $b_{n-1}$ rows and columns, wherein the rows and columns are labeled consecutively from 0 to $b_{n-1}-1$, wherein said matrix has ones in column $b_0$ at the intersection of the rows that are the elements of B, and wherein the matrix also has ones on the super-diagonal beginning at $(b_0, b_1)$ and extending through $(b_{n-2}, b_{n-1})$ and zeros everywhere else.

4. The method of claim 2 wherein said elements $k_1$ through $k_{n-1}$ of the transition location set, K, are determined by recursively finding $k_i$ for $1 \, k_1 \leq i \leq n-1$ and $k_0=1$ such that the detection regions plus any allowed margin for adjacent $k_i$'s abut, wherein the size of these detection regions and margin are determined by two noise or uncertainty variables associated with any $k_i$, said variables being an additive noise variance, $\sigma_N$, that is the same for all location elements, $k_i$, and a multiplicative noise variance, $\sigma_{jkT}$, which is a function of element location, $k_i$, e.g., $\sigma_{jkT}=\rho k_i T=\rho T_i$ for the jitter constant, $\rho$.

5. The method of claim 4 wherein the size of the detection region for any $k_i$ uses the mean square variance, $\sigma_{ai}=\sqrt{\sigma_a^2+\sigma_x^2}$, and a chosen probability of occurrence for this variance to find $k_i$ given $k_{i-1}$.

6. The method of claim 1 where the allowed run-lengths of zeros in said output string of binary channel bits are 2, 5, 9 and 15 and p/q is 2/7 in a (2, 5, 9, 15) RLS code.

7. The method of claim 2 where the elements $k_1$ through $k_{n-1}$ of the transition location set, K, are determined by finding $k_i$ for $1 \leq i \leq n-1$ and $k_0=1$ such that the detection regions for adjacent $k_i$'s abut and that these two regions are of size $\pm a k_i$ where a is constant for a particular code and such that geometrically spaced regions place transitions at multiples of the value $r=(1-a)/(1+a)$ from one another such that the resulting n element code has transition locations at $b_0$, $rb_0$, $r^2b_0$, ..., $r^{n-1}b_0$ and is also designated by the 2-tuple (r, n).

8. The method of claim 1 where the allowed run-lengths of zeros are 0, 1 and 3 and p/q is 4/5 in a (0, 1, 3) run length selected code also denoted a (2, 3) geometric code with ratio number 2.

9. Apparatus for selectively spaced encoding of an input string of binary data bits which is a random sequence of 0's and 1's into an output string of binary channel bits comprising:

an input register for holding p binary input data bits;

an output register for holding q binary channel output bits; and an encoder connected to said input register and to said output register for recursively encoding an input string of binary data bits according to run-length selection means having rate p/q where p is the amber of input data bits that are encoded into q channel bits; wherein the channel bits obey constraints such that the encoding specifies an ordered n element list of integers that are the lengths of the selected runs of consecutive zeros, denoted $(b_0-1, b_1-1, \ldots, b_{n-1}-1)$ where the elements of the list are not all equally spread, wherein there exists three consecutive elements of the list $(b_j, b_j, b_k)$, such that $b_j-b_j \neq b_k-b_j$; and wherein successive spacings between elements are nonlinear and increase from previous spacings, thus optimizing encoding in a high jitter environment.

10. The apparatus of claim 9 wherein said input register is a serial-in-parallel-out input register and wherein said output register is a parallel-in-serial-out output register.

11. The apparatus of claim 10, wherein said encoder includes combinational logic representing an encoding table for effecting said recursive encoding, said encoding table including both next state and an output, and further including a parallel-in-parallel-out state register connected to said encoder for holding the present state of said encoding table.

12. The apparatus of claim 11 wherein said encoder is a read-only memory for holding said encoding table.

13. The apparatus of claim 11 wherein said output string of binary channel bits constitutes a (2, 5, 9, 15) rate 2/7 run-length selected code and wherein said encoding table is that depicted in FIG. 10.

14. The apparatus of claim 11 wherein said output string of binary channel bits constitutes a (2,3) rate 4/5 run-length selected code and wherein said encoding table is that depicted in FIG. 11.

* * * * *